United States Patent
Pio

(10) Patent No.: US 7,601,590 B2
(45) Date of Patent: *Oct. 13, 2009

(54) ELECTRONIC MEMORY CIRCUIT AND RELATED MANUFACTURING METHOD

(76) Inventor: Federico Pio, Via Volturno Fontana, 80, I-20047 Brugherio (Milano) (IT)

( * ) Notice: Subject to any disclaimer, the term of this patent is extended or adjusted under 35 U.S.C. 154(b) by 638 days.

This patent is subject to a terminal disclaimer.

(21) Appl. No.: 11/033,776

(22) Filed: Jan. 12, 2005

(65) Prior Publication Data

US 2005/0122778 A1 Jun. 9, 2005

Related U.S. Application Data

(62) Division of application No. 09/779,956, filed on Feb. 9, 2001, now Pat. No. 6,852,596, which is a division of application No. 09/364,766, filed on Jul. 30, 1999, now Pat. No. 6,215,688.

(51) Int. Cl.
*H01L 21/336* (2006.01)

(52) U.S. Cl. .............. 438/258; 438/266; 257/E21.422

(58) Field of Classification Search ............... 438/258, 438/266

See application file for complete search history.

(56) References Cited

U.S. PATENT DOCUMENTS

| 4,379,343 A | 4/1983 | Moyer ..................... 365/185 |
| 4,380,057 A | 4/1983 | Kotecha et al. ............. 365/185 |
| 5,066,992 A | 11/1991 | Wu et al. .................. 357/23.5 |
| 5,471,423 A | 11/1995 | Iwasa .................... 365/185.01 |
| 5,646,886 A | 7/1997 | Brahmbhatt ........... 365/185.16 |
| 5,677,871 A | 10/1997 | Pio et al. ............... 365/185.11 |
| 5,798,547 A | 8/1998 | Urai ........................... 257/316 |
| 5,981,340 A | 11/1999 | Chang et al. .............. 438/258 |
| 5,982,669 A | 11/1999 | Kalnitsky et al. ...... 365/185.28 |
| 5,986,934 A | 11/1999 | Kao et al. .................... 365/185 |
| 6,852,596 B2 * | 2/2005 | Pio ............................ 438/266 |

FOREIGN PATENT DOCUMENTS

| EP | 0996161 | 4/2000 |
| JP | 61 256673 | 11/1986 |
| JP | 8 316438 | 11/1996 |

* cited by examiner

*Primary Examiner*—Jack Chen
(74) *Attorney, Agent, or Firm*—Trop, Pruner & Hu, P.C.

(57) ABSTRACT

An electronic memory circuit comprises a matrix of EEPROM memory cells. Each memory cell includes a MOS floating gate transistor and a selection transistor. The matrix includes a plurality of rows and columns, with each row being provided with a word line and each column comprising a bit line organized in line groups so as to group the matrix cells in bytes, each of which has an associated control gate line. A pair of cells have a common source region, and each cell symmetrically provided with respect to this common source region has a common control gate region.

7 Claims, 12 Drawing Sheets

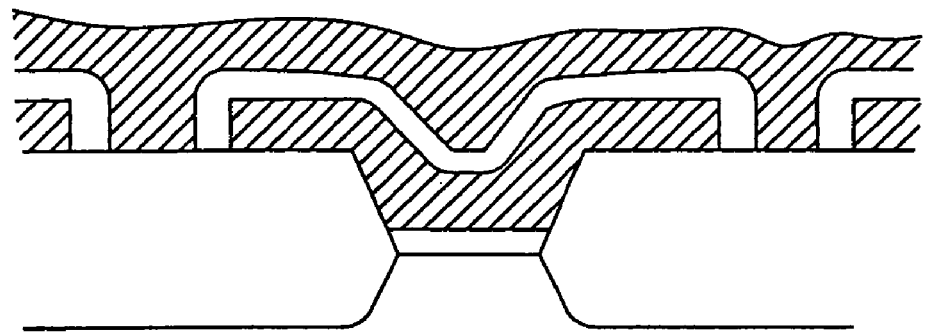
FIG. 4.
(PRIOR ART)
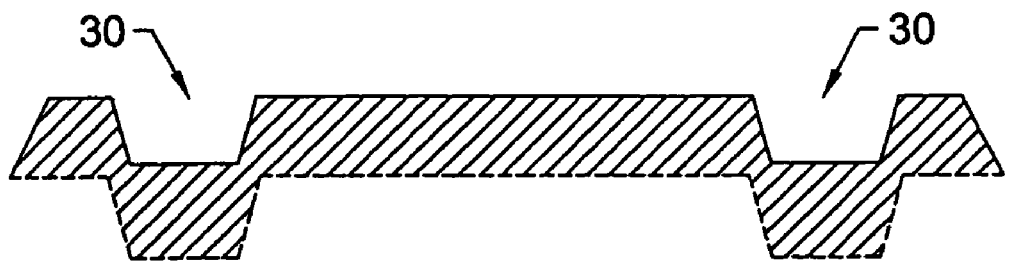
FIG. 5.
(PRIOR ART)

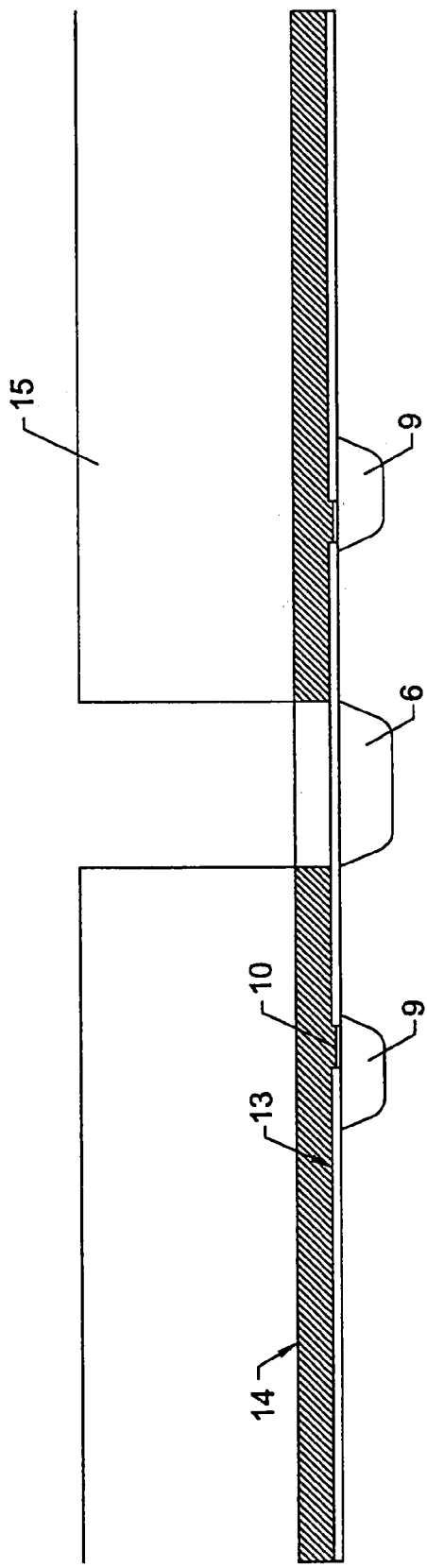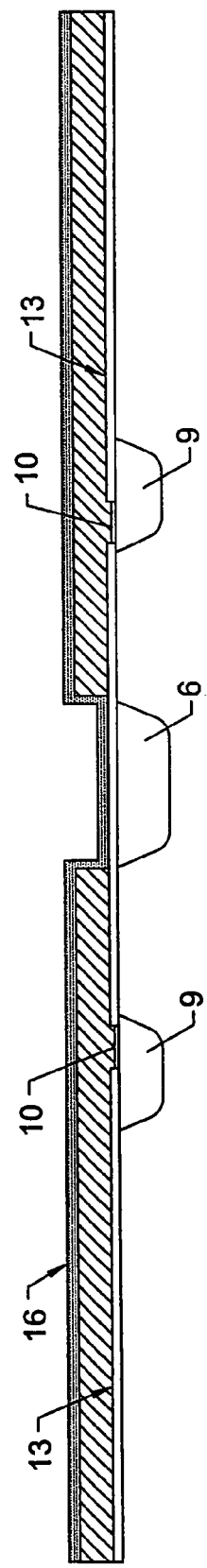

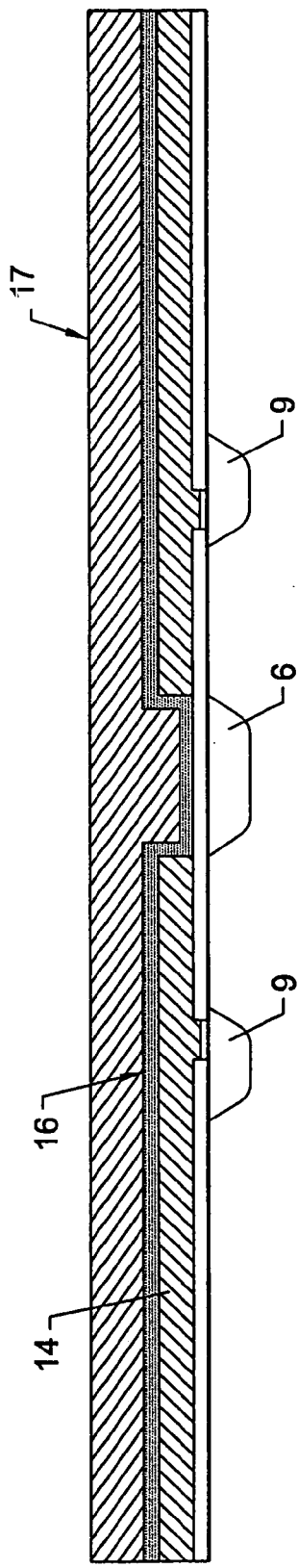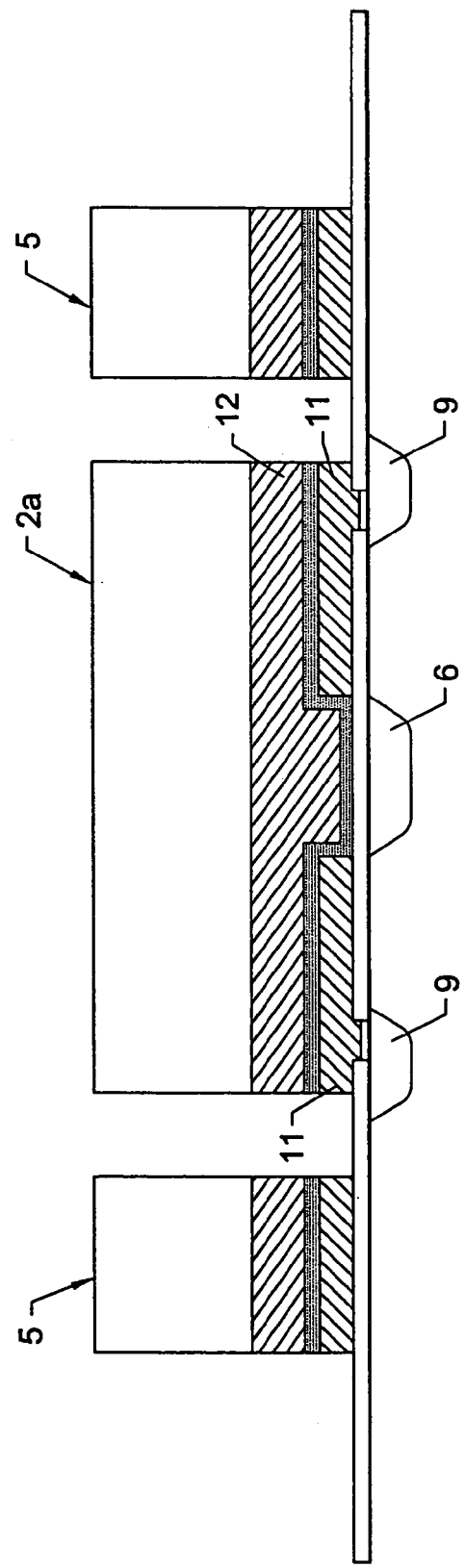

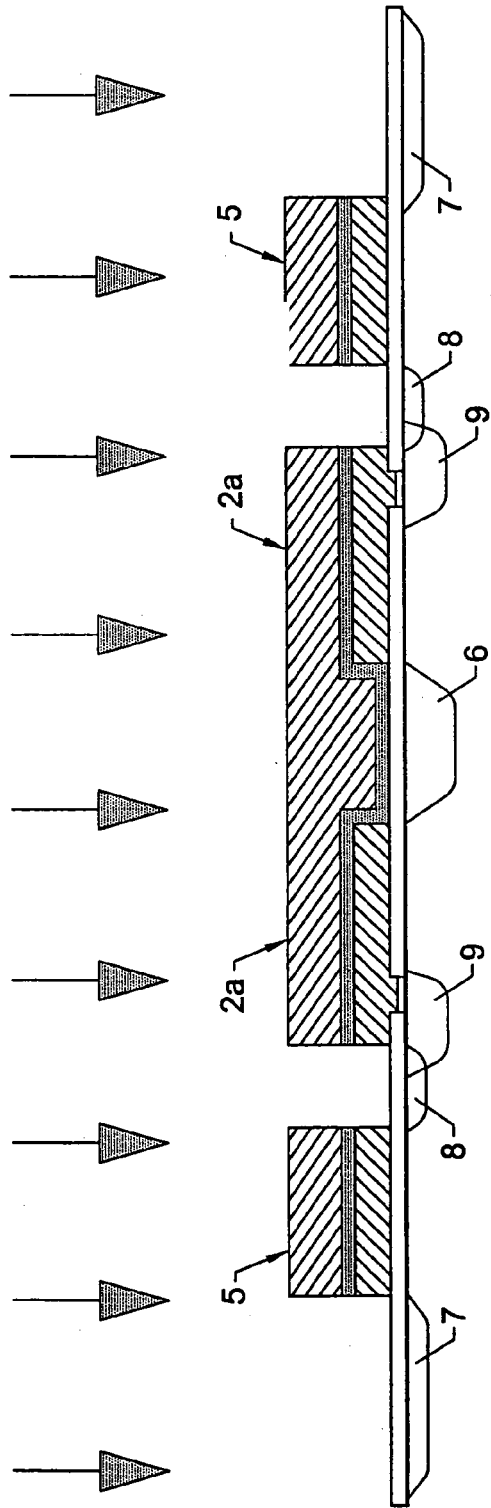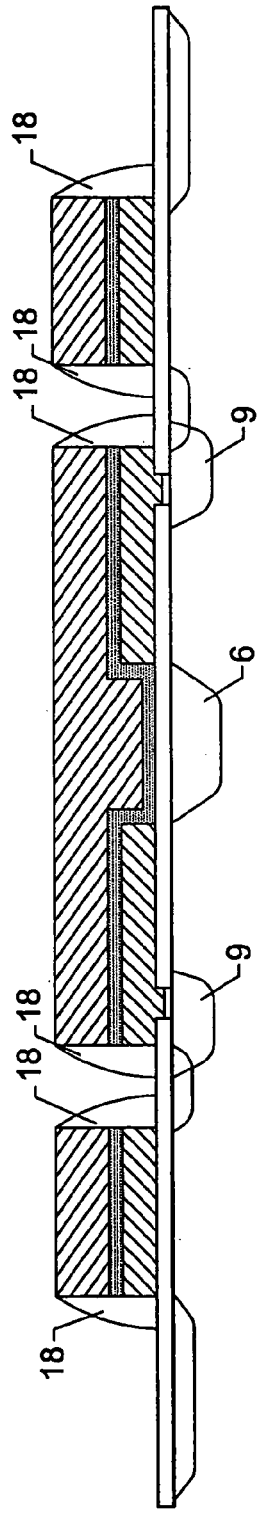

ELECTRONIC MEMORY CIRCUIT AND RELATED MANUFACTURING METHOD

CROSS-REFERENCE TO RELATED APPLICATIONS

This is a divisional patent application of U.S. patent application Ser. No. 09/779,956 filed Feb. 9, 2001, now U.S. Pat. No. 6,852,596 which, in turn, is a divisional patent application of Ser. No. 09/364,766 filed Jul. 30, 1999, now U.S. Pat. No. 6,215,688, the entire disclosures of which are hereby incorporated in their entirety.

FIELD OF THE INVENTION

The present invention relates to circuits, and, more particularly, to an electronic memory circuit.

BACKGROUND OF THE INVENTION

As known, EEPROM memories, while being a non-volatile type of memory, allow electrical modification of the information contained therein in either a write or an erase step. It is also known that each EEPROM cell comprises a floating gate transistor and a selection transistor. Once the selection transistor is enabled, it is possible to alter the state of the associated floating gate transistor, by exploiting a passage of electrons for tunnel effect through a thin layer of silicon oxide, the so-called tunnel oxide. Such a thin layer is provided below a portion of the floating gate region of the floating gate transistor, in which the charge is stored.

During the write and erase steps of the cells, positive voltages are usually applied to the diffusion below the tunnel region or to the control gate. Such voltages are between 8 and 18 Volts in order to generate a sufficiently high electrical field at the opposite ends of the thin oxide to activate the tunnel effect efficiently.

According to the prior art as shown in FIGS. 1-5, the matrix includes a structure 1' comprising a plurality of rows 3' and a plurality of columns 4'. Rows 3' comprise Word Lines WL'1, WL'm. Columns 4' instead comprise Bit Lines BL' of the matrix and the Control Gate Lines CG'. Preferably, the Bit Lines BL' are grouped in bytes, i.e. in groups of eight bits, BL'0 . . . BL'7. In particular, each byte has an associated line CG'.

At the crossing of a word line WL' and of a bit line BL', a selection transistor 5' is provided. Further on, a bit line BL' connects together all the drain terminals of the selection transistors 5' common to a given column 4' of the matrix. Every selection transistor 5' is associated and connected in series to a MOS floating gate transistor 2a'.

In more detail as shown in FIG. 3, the EEPROM memory cell 2' comprises a MOS transistor 2a' with a floating gate region 6' wherein the charge is stored that allows the two different states of the cell to be distinguish: i.e. "written" or "erased". A control gate region 7', is capacitively coupled to the floating gate region 6' through an intermediate, interpoly dielectric layer. Through such dielectric layer, voltage is transferred to the floating gate region 6' from the control gate region 7', during the write and/or erase steps of the cell 2'. The control terminal of the control gate region 7' is common to all the cells 2' forming a same byte in the structure 1'. The erasing of a byte is accomplished by addressing the word line WL'i corresponding to the desired i-th line and the control gate line CG'j corresponding to the selected byte.

The prior art process for making these memory cells on a P-type silicon substrate, with the control gate region self-aligned with the floating gate region, includes: the formation of active areas; the implantation of doped regions of N+ type; the formation of oxides of different thickness; the deposition and the following selective removal of a first layer of polysilicon for defining the floating gate regions in the direction of the Word Lines; the formation of an interpoly dielectric; the deposition and the following selective removal of a second layer of polysilicon for defining the control gate lines and the floating gate regions self-aligned to the control gate regions; and the implantation of the source and drain regions.

In order to achieve good operation of the matrix the control gate line CGj of each byte is required to be electrically separated from the control gate line of the other bytes. During the formation of the floating gate regions, the first layer of polysilicon between the floating gate regions belonging to adjacent cells of the same byte is removed; this step defines the floating gate regions in the direction of the line.

In order to minimize the area of each cell, it is desirable that the control gate lines of adjacent bytes be very close to each other. Therefore, during the above-described process step, the first layer of polysilicon is removed also by the source line portion common to two adjacent bytes. As previously described, after the above step is carried out, an intermediate oxide layer and then the second layer of polysilicon are formed, in order to make the control gate region. In order to make the final gate region of the floating gate transistor, a selective removal of the stack including the second layer of polysilicon, of the dielectric interpoly layer and of the first layer of polysilicon, is respectively carried out. This last removal is required in the process for making the final gate region and defines the length thereof.

In the portion of the source region common to two bytes, wherein the first layer of polysilicon has been removed during the first step of definition of the floating gates, the second step of removal of the first layer of polysilicon for defining the final gate region is not selective enough for discriminating the first layer of polysilicon or the surface of the substrate of silicon in single-crystal form. Therefore, the surface of the source region has notches 30 as shown in FIG. 5.

This surface arrangement of the common source region has various drawbacks. First of all, these notches may become receptacles for contaminating material, which would be hard to remove because of the small dimensions of the notches 30 themselves. Further, because of the differences in height present on the surface of the source region, the subsequent implantation of dopant provides non-uniform implanted region. This increases the resistance of the common source region. This drawback is particularly significant for the EEPROM parallel access memory matrices, because all the cells of the same byte will be read at the same time and thus the current in the common source region will reach relatively high values. This may lead to a read error on the single memory cell because of the resistance introduced by the presence of these notches.

SUMMARY OF THE INVENTION

An object of the present invention is to provide an electronic memory circuit wherein the control gate line is electrically common to pairs of cells belonging to the same byte.

These and other advantages, features and objects in accordance with the present invention are provided by an electronic memory circuit comprising a matrix of EEPROM memory cells, each memory cell incorporating a MOS floating gate transistor and a selection transistor. The matrix includes a plurality of rows and columns, each row being provided with a word line and each column comprising a bit line organized in line groups so as to group the matrix cells in bytes, each of which has a associated control gate line. A pair of cells having a common source region, and each cell being arranged symmetrically with respect to the common source region, has a common control gate region. Advantageously, the common control gate region covers the common source region.

BRIEF DESCRIPTION OF THE DRAWINGS

The present invention will now be described more fully hereinafter with reference to the accompanying drawings, in which preferred embodiments of the invention are shown. This invention may, however, be embodied in many different forms and should not be construed as limited to the embodiments set forth herein, wherein:

FIG. 4 is an enlarged cross-sectional schematic view, taken along the line IV-IV of FIG. 2 of a portion of a semiconductor, including an EEPROM memory cell according to the prior art;

FIG. 5 is an enlarged cross-sectional schematic view, taken along the line V-V of FIG. 2 of a portion of a semiconductor, including an EEPROM memory cell according to the prior art;

FIGS. 9 to 16 are cross-sectional views illustrating the process steps for making the EEPROM memory cells according to the present invention;

DETAILED DESCRIPTION OF THE PREFERRED EMBODIMENTS

Figure 6:
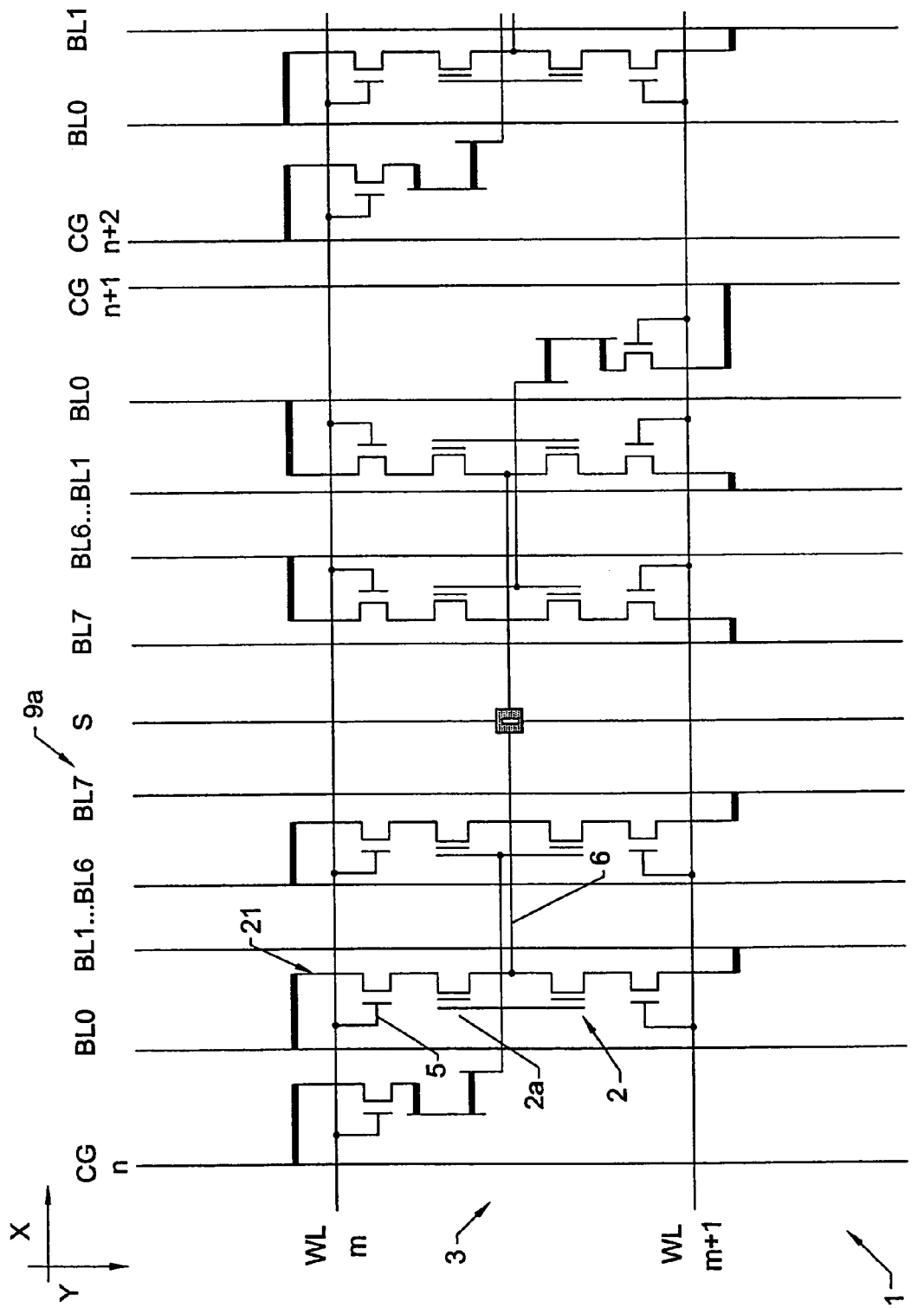
FIG. 6 is a schematic view of an electronic circuit made according to the present invention.
Figure 7:
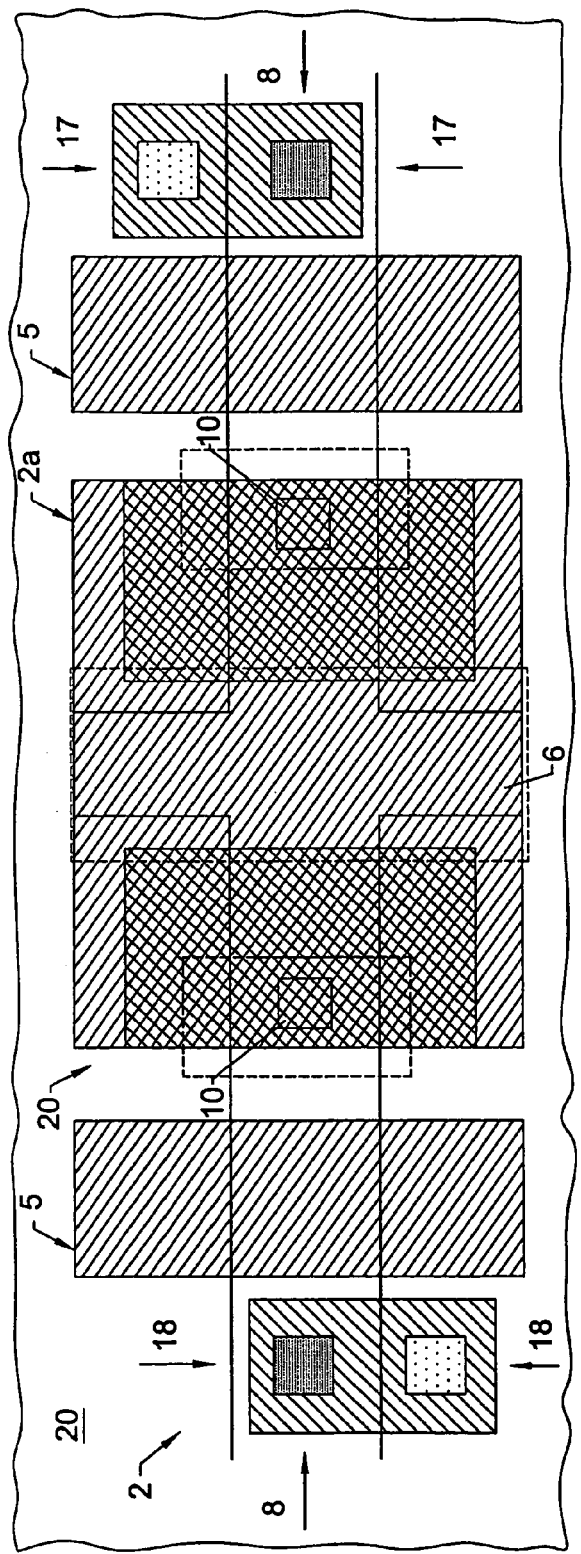
FIG. 7 is an enlarged schematic view, from above, of a portion of a semiconductor wherein an EEPROM memory cell is included in the electronic circuit according to the present invention.
Figure 8:
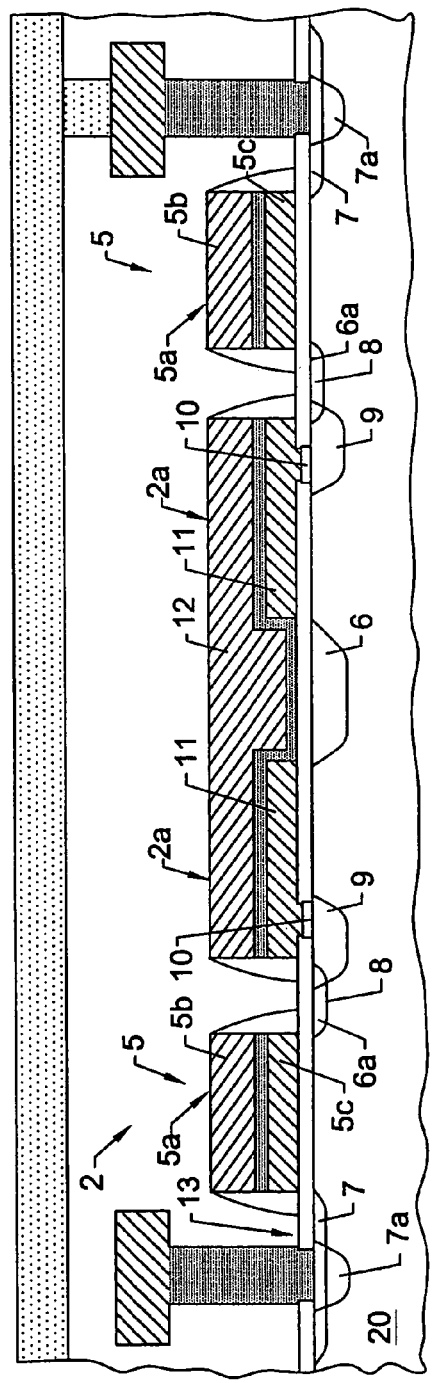
FIG. 8 is an enlarged cross-sectional schematic view, taken along the line VIII-VIII of FIG. 7 of a portion of a semiconductor, including EEPROM cells according to the present invention.
Figure 15:
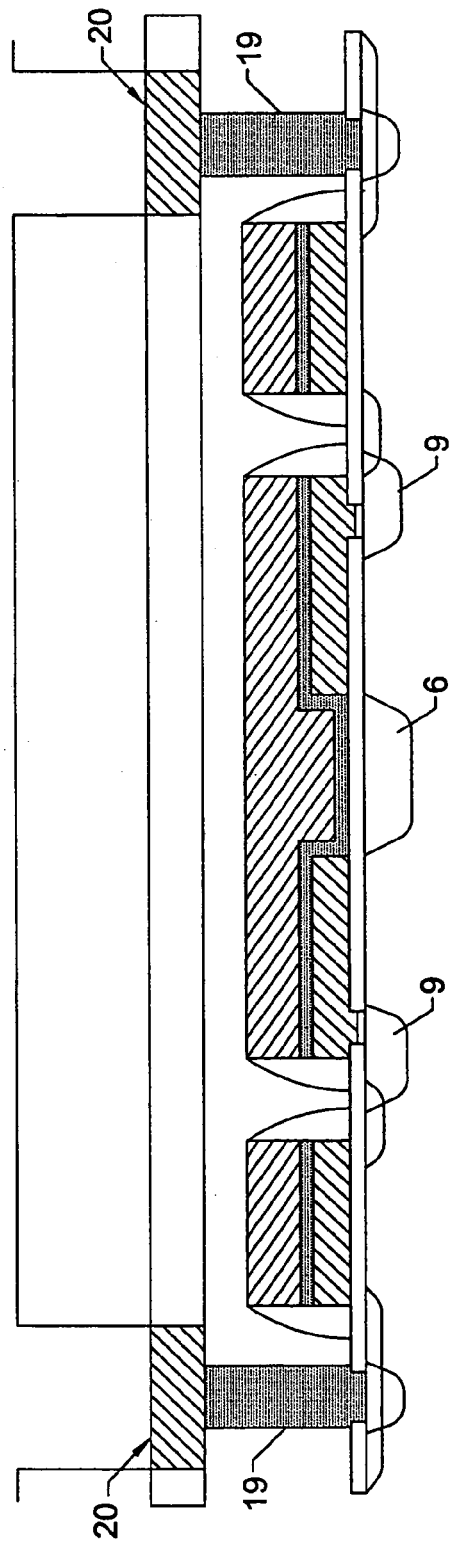
Figure 16:
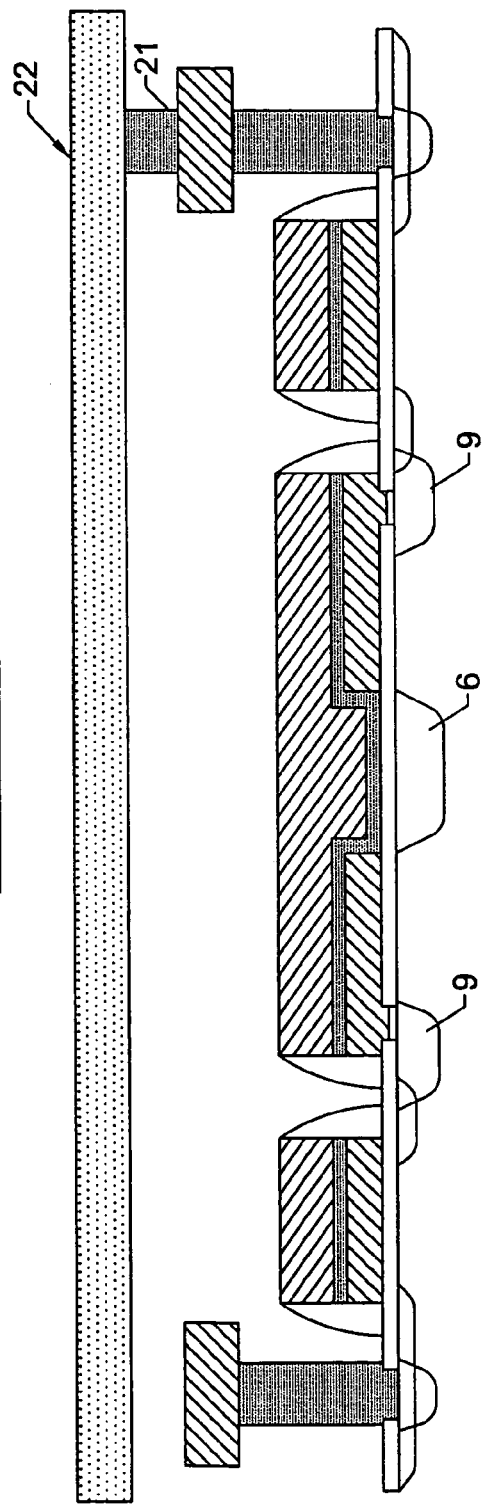

With reference to the drawings, an electronic memory circuit 1 including a matrix of EEPROM memory cells 2 will now be described. The structure 1 is realized as a semiconductor integrated circuit, incorporating, for example, thousands of cells 2. In FIG. 6 only a portion of such circuit is indicated. The matrix according to the invention includes a plurality of rows 3, comprising the word lines WL1, WLm and a plurality of columns 4 comprising bit lines of the matrix.

The columns 4 also comprise control gate lines CG. Groups of eight lines of bit, BL0, BL1 . . . BL7 are grouped in a byte 9a. For each byte 9a, a memory cell 2 is connected to each bit line Bli. Each EEPROM cell 2 comprises a MOS transistor 2a connected in series to a selection transistor 5, as would readily be appreciated by those skilled in the art. In particular each selection transistor comprises a source region 6a and a drain region 7 of N-type formed in a substrate 20 of P-type.

As is typical, such region 7 also comprises a contact region 7a realized with an implantation of N+ type dopant. A gate region 5a, insulated from the substrate 20, by the oxide layer 13 is between the source region 6a and the drain region 7. The gate region 5a comprises two superimposed regions of polysilicon 5b, 5c realized respectively in a first and second layer of polysilicon 14, 17 by the interposition of the intermediate dielectric layer 16; the two regions 5b, 5c are then electrically short-circuited outside the cell.

The floating gate transistor 2a comprises a source region 6 and a drain region 8, coincident with the source region 6a of the selection transistor 5. In each floating gate transistor 2a, between the source region 6 and the drain region 8, the channel region is provided, onto which a floating gate region 11 is arranged, formed by the first layer of polysilicon 14 and insulated from the substrate by a layer of gate oxide 13 that has a thinner portion referenced as the tunnel oxide 10.

Figure 19:
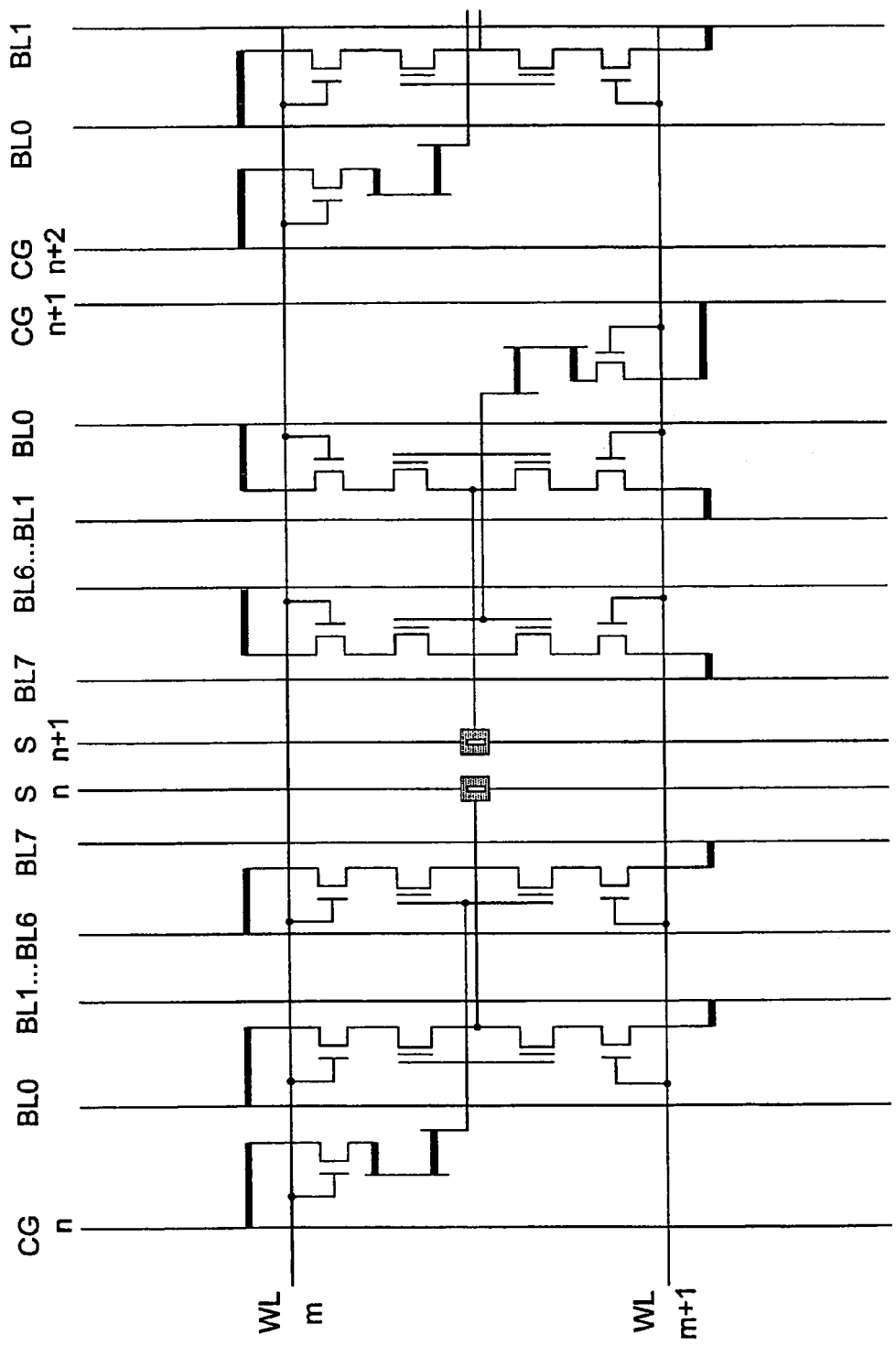
FIG. 19 is a schematic view of a second embodiment of the circuit according to the invention.

The drain region 8 is realized in the substrate by an N-type dopant implantation. Corresponding to this drain region 8, an implanted N+ type region 9 is realized, that extends below the tunnel region 10. The source region 6 of the cell 2 is realized by an implantation of N-type dopant in the substrate 2. Advantageously, such region is common to pairs of cells 2 belonging to the same byte 9a. Advantageously, the source region 6 and the implanted N+ type region 9 may be realized with a same implantation of dopant of N+ type. The source regions 6 of all cells 2 belonging to the same byte 9a form an only line of source. The source lines are then connected to a common metallization line S. Advantageously, the source lines of each byte column 9a are in contact with a respective source line Si (FIG. 19).

A control gate region 12 is coupled capacitively to the floating gate region 11 by an intermediate layer of dielectric material, the interpoly, and is realized with the second layer 17 of polysilicon. According to the invention, for each pair of cells, the control gate region 12 is physically and electrically connected and completely covers the common source region 6. The control gate line CG is connected by an enabling transistor T to the control gate regions 12 of the pairs of cells. This enabling switch T is realized by a MOS transistor, as would be appreciated by the skilled artisan. As shown in FIG. 6, pairs of cells belonging to the same byte 9a are addressed by two adjacent word lines WLm, WLm+1.

Figure 20:
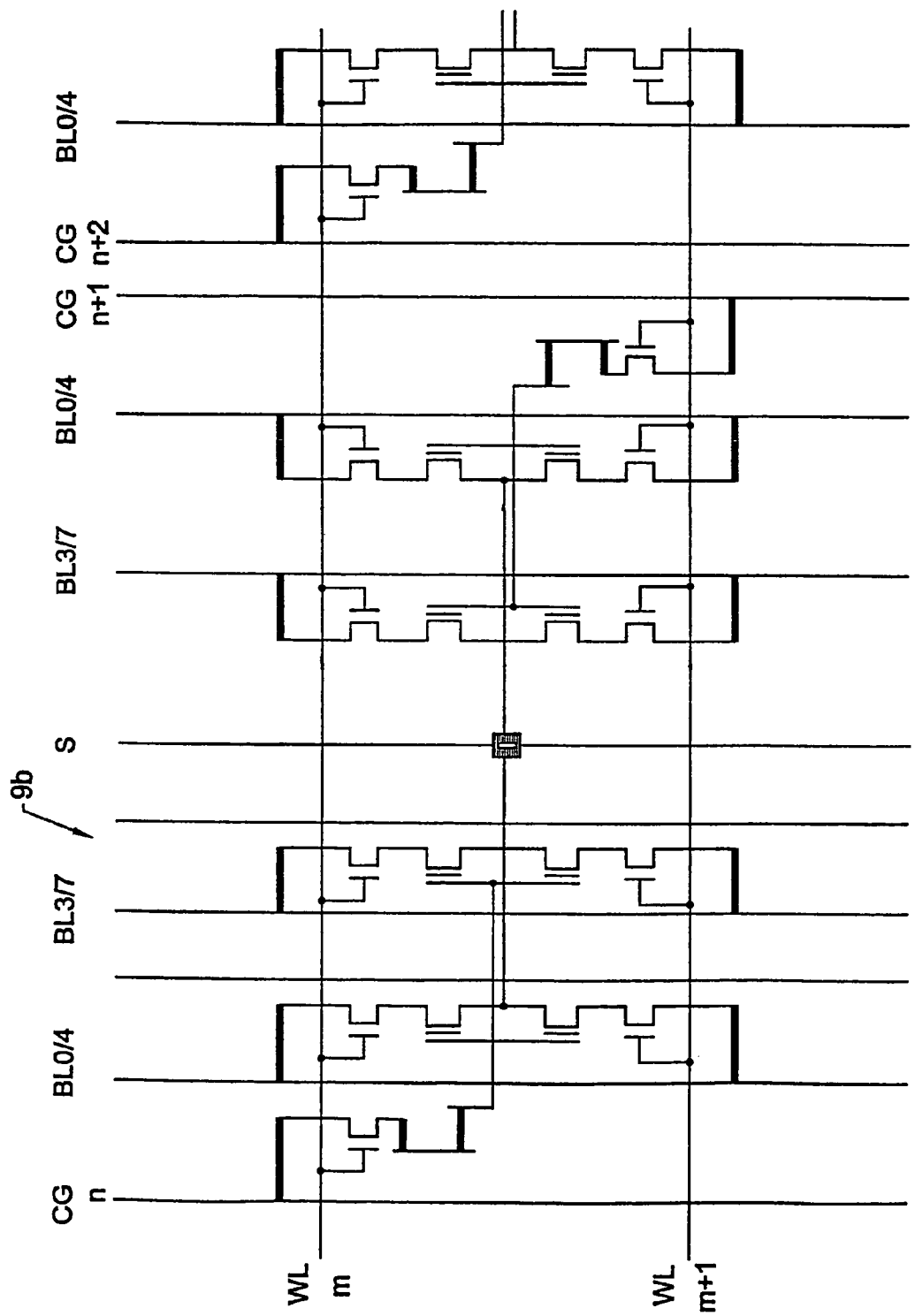
FIG. 20 is a schematic view of a third embodiment of the circuit according to the invention.

Another embodiment of the invention is shown in FIG. 20, wherein each byte 9b comprises four lines of bits BL0/4, BL1/5, BL2/6, BL3/7. For each byte 9, each bit line BLi is connected to two cells having the source region in common, such cells, as well, being addressed by two adjacent word lines WLm, WLm+1. Advantageously, such an embodiment is even more compact.

More in particular, the process steps that lead to the realization of a matrix of cells according to the invention are described hereinbelow. The cells 2 of the matrix 1 are realized with MOS technology from a P-doped semiconductor substrate 20. The process for making the circuit according to the invention includes: the formation of active areas; the implantation of N+ and/or N doped regions 6, 9; and the formation of oxides 10, 16 of different thickness.

According to the invention, a first layer 14 of polysilicon is deposited as shown in FIG. 9, and is selectively removed by a photolithographic process that uses a mask 15 to make the source region 6. The intermediate oxide layer 16 is then formed on the entire surface of the substrate 20 as shown in FIG. 10. A second layer 17 of polysilicon is deposited (FIG. 11) and then selectively removed in order to form the control gate 12 of the pairs of cells 2 that have the source region 6 in common and the gate region of the selection transistor. In this process step, the floating gate regions 11 of the floating gate transistors 2a are also defined.

The process concludes with the following conventional steps to attain: the implantation of the N-doped source and drain regions 7, 8 (FIG. 13); spacers 18 (FIG. 14); the N-channel and P-channel transistors of the circuitry associated to the structure 1; and intermediate dielectrics. Respective first and a second contacts 19, 21 are then opened, covered by a first layer 20 and a second layer 22 of metallization, respectively, thereby forming the bit lines BL.

Figure 17:
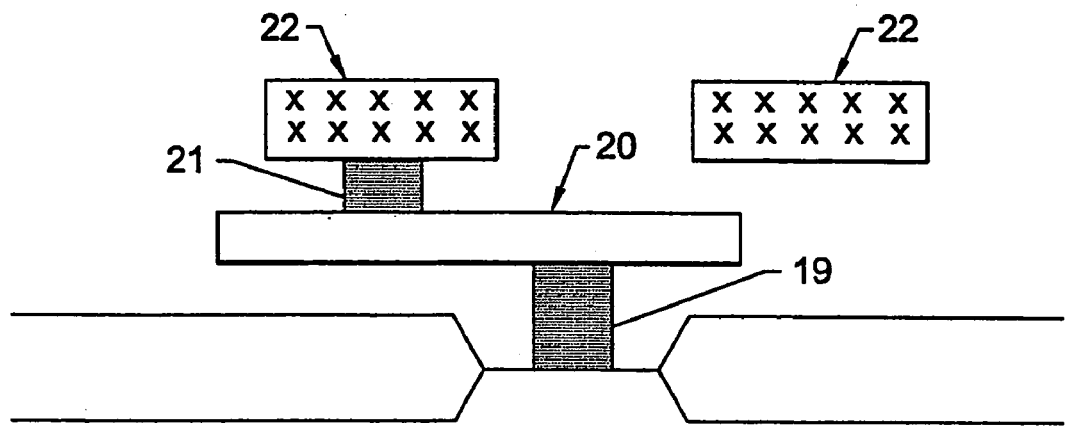
FIG. 17 is an enlarged cross-sectional schematic view, taken along the line XVII-XVII of FIG. 7.
Figure 18:
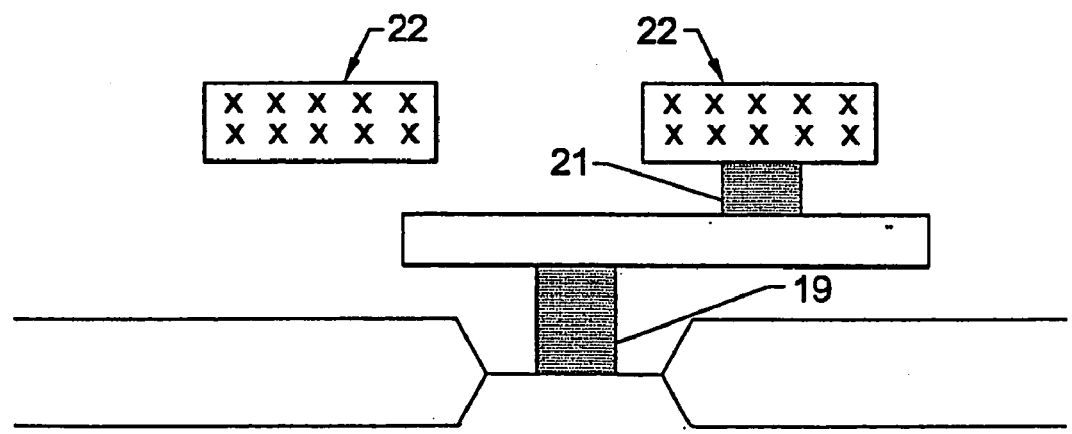
FIG. 18 is an enlarged cross-sectional schematic view, taken along the line XVIII-XVIII of FIG. 7.

In FIGS. 17 and 18, a detailed illustration is made of the realization of these contacts in the drain region of the selection transistor and of the bit lines BL. Nothing prevents, however, the forming of such bit lines with the first metallic layer.

Figure 1:
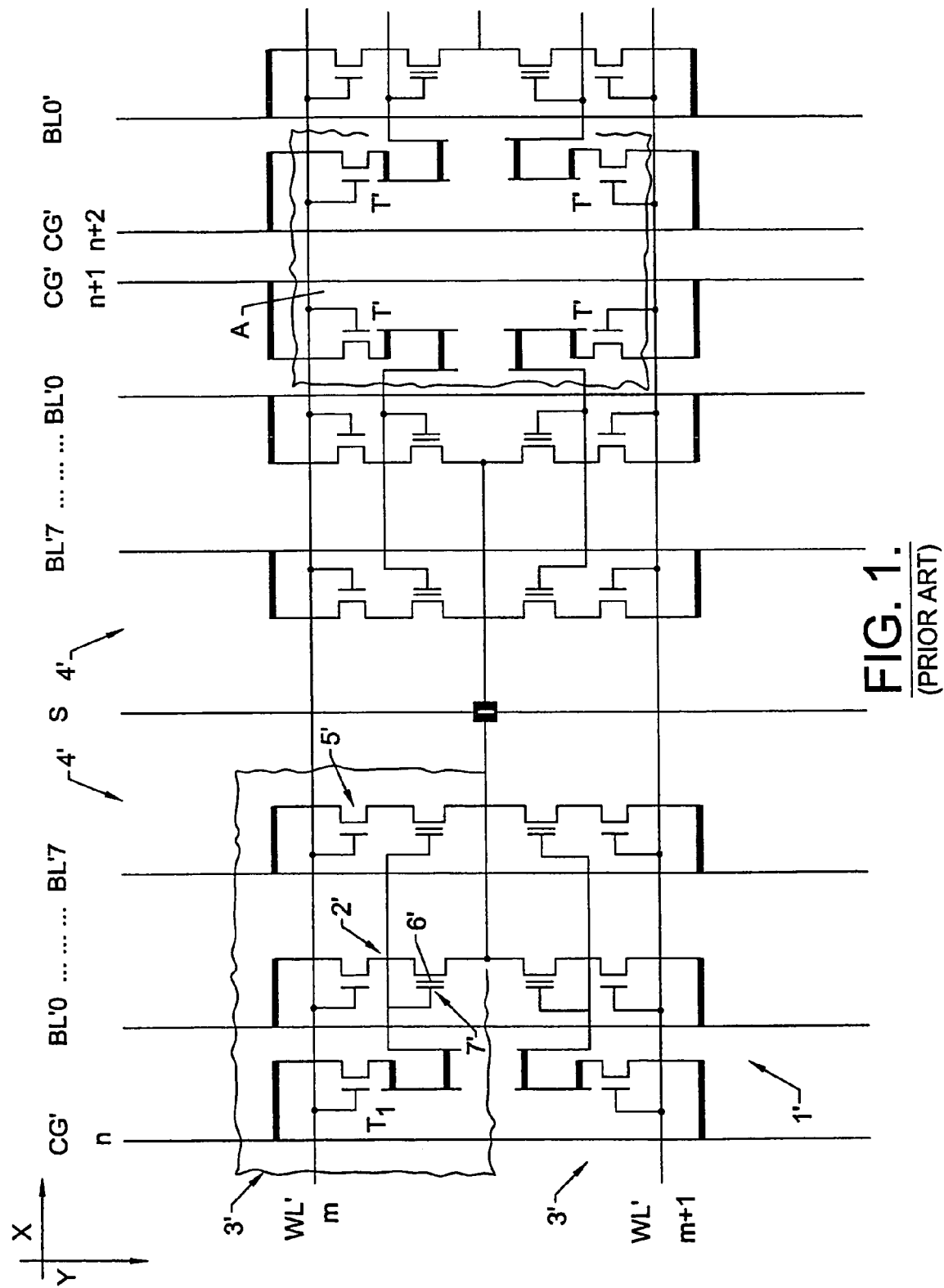
FIG. 1 is a schematic view of a circuit structure made according to the prior art.
Figure 2:
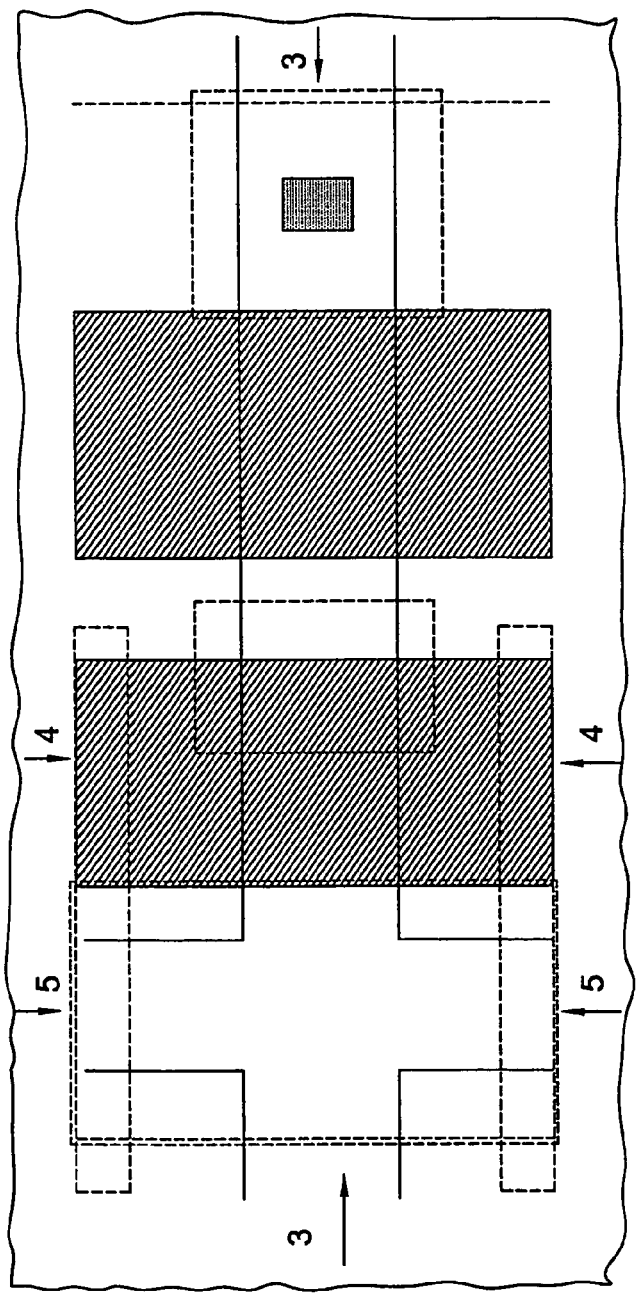
FIG. 2 is an enlarged schematic view, from above, of a portion of a semiconductor wherein an EEPROM memory cell is included in the circuit structure according to the prior art.
Figure 3:
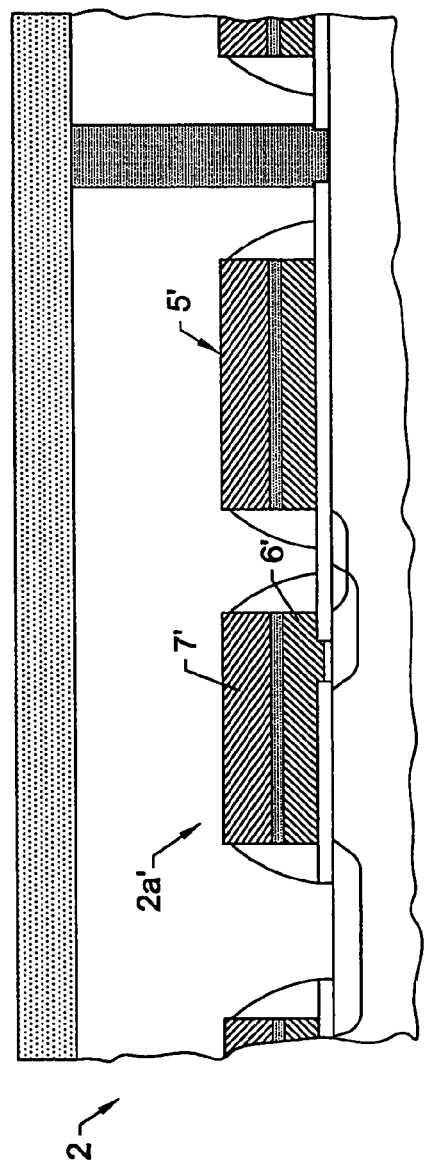
FIG. 3 is an enlarged cross-sectional schematic view, taken along the line III-III of FIG. 2 of a portion of a semiconductor, including an EEPROM memory cell according to the prior art.

As shown in FIG. 6, the structure is of particularly reduced dimensions. It is worth noting that in the prior art (FIG. 1), an enabling transistor T' of the Control Gate line CG' is provided for each word line WL'i. In virtue of the symmetry of the matrix both in X- and Y-direction, in the semiconductor portion A of FIG. 1, four enabling transistors T' are provided.

Conversely, in the embodiment according to the present invention, only one enabling transistor for every two WL lines is required. The circuit according to the invention may be therefore rendered compact, occupying a smaller area than the area of a conventional cell, in particular along the X direction, should the same technology be used. The circuit according to the invention, realized according to the above described process substantially resolves the technical problem and achieves several advantages, which are highlighted below.

The provision of only one control gate region avoids holes on the substrate surface wherein the source region of the EEPROM memory cells is realized. Furthermore, the structural architecture of the memory cell according to the invention saves a step in the decoding process of the memory.

Of course many modifications and variations may be carried out on the herein described and illustrated memory cells, all falling within the scope of the invention, as defined in the following claims.

That which is claimed is:

1. A method of making an integrated circuit comprising:
   forming a plurality of rows and columns of memory cells, each memory cell including a MOS floating gate transistor and a selection transistor; and
   symmetrically arranging the memory cells in pairs with respect to a common source region, each pair of memory cells having a common control gate region;
   each row of memory cells comprising a word line and each column of memory cells comprising a bit line organized in line groups to group the memory cells in bytes, each byte having an associated control gate line.

2. A method according to claim 1 wherein each memory cell comprises an EEPROM cell.

3. A method according to claim 1 wherein the pairs of memory cells having the common source region belong to a same byte.

4. A method according to claim 3 wherein the common control gate regions of the pairs of memory cells belonging to the same byte are connected to a common control gate line.

5. A method according to claim 4 further comprising forming an enabling transistor to address the common control gate line.

6. A method according to claim 5 wherein the enabling transistor comprises a MOS transistor.

7. A method according to claim 1 wherein the common control gate region overlies the common source region.

* * * * *